US011309338B2

(12) United States Patent
Watanabe et al.

(10) Patent No.: US 11,309,338 B2
(45) Date of Patent: Apr. 19, 2022

(54) DISPLAY DEVICE AND ELECTRONIC APPARATUS

(71) Applicant: SONY CORPORATION, Tokyo (JP)

(72) Inventors: Toshihiko Watanabe, Tokyo (JP); Akiyoshi Aoyagi, Kanagawa (JP); Hirokazu Nakayama, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 87 days.

(21) Appl. No.: 16/301,067

(22) PCT Filed: Mar. 28, 2017

(86) PCT No.: PCT/JP2017/012710
§ 371 (c)(1),
(2) Date: Nov. 13, 2018

(87) PCT Pub. No.: WO2017/203822
PCT Pub. Date: Nov. 30, 2017

(65) Prior Publication Data
US 2019/0189646 A1 Jun. 20, 2019

(30) Foreign Application Priority Data

May 24, 2016 (JP) .............................. JP2016-103229

(51) Int. Cl.
*H01L 27/12* (2006.01)
*H05K 3/34* (2006.01)
(Continued)

(52) U.S. Cl.
CPC ........ *H01L 27/1244* (2013.01); *H01L 23/145* (2013.01); *H01L 23/49838* (2013.01);
(Continued)

(58) Field of Classification Search
CPC ........... H01L 27/1244; H01L 23/49866; H01L 23/145; H01L 23/49838; H01L 27/1259;
(Continued)

(56) References Cited

U.S. PATENT DOCUMENTS 5,768,109 A 6/1998 Gulick et al.
5,837,427 A * 11/1998 Hwang ............... H01L 21/4857
430/312

(Continued)

FOREIGN PATENT DOCUMENTS

AU 1855092 A 3/1993
CA 2071662 A1 12/1992
(Continued)

OTHER PUBLICATIONS

International Search Report and Written Opinion of PCT Application No. PCT/JP2017/012710, dated May 23, 2017, 02 pages of translation and 11 pages of ISRWO.

*Primary Examiner* — Anthony J Frost
(74) *Attorney, Agent, or Firm* — Chip Law Group

(57) ABSTRACT

Provided is a display device and an electronic apparatus that prevent the occurrence of failure in the connection between a mounting substrate and an electronic component. The display device includes an interconnection layer provided on a support substrate, a plurality of insulating layers provided above the interconnection layer, an opening provided in parts of the insulating layers, and a metal layer electrically connected to the interconnection layer and filling the opening up to a height below a layer surface of the insulating layer.

11 Claims, 8 Drawing Sheets

(51) Int. Cl.
*H05K 3/46* (2006.01)
*H05K 1/18* (2006.01)
*H01L 23/498* (2006.01)
*H01L 23/14* (2006.01)
*H05K 1/11* (2006.01)
*H05K 3/42* (2006.01)

(52) U.S. Cl.
CPC .... *H01L 23/49866* (2013.01); *H01L 27/1259* (2013.01); *H05K 1/112* (2013.01); *H05K 1/18* (2013.01); *H05K 3/34* (2013.01); *H05K 3/422* (2013.01); *H05K 3/423* (2013.01); *H05K 3/46* (2013.01); *H05K 2201/09609* (2013.01); *H05K 2203/072* (2013.01); *H05K 2203/0723* (2013.01)

(58) Field of Classification Search
CPC .. H05K 1/18; H05K 3/46; H05K 3/34; H05K 3/423; H05K 3/422; H05K 1/112; H05K 2203/0723; H05K 2203/072; H05K 2201/09609
See application file for complete search history.

(56) References Cited

U.S. PATENT DOCUMENTS

| | | | |
|---|---|---|---|
| 2001/0020549 A1* | 9/2001 | Horiuchi | H01L 24/16 174/263 |
| 2004/0160170 A1* | 8/2004 | Sato | H01L 51/5228 313/504 |
| 2005/0215045 A1 | 9/2005 | Rinne et al. | |
| 2007/0048886 A1* | 3/2007 | Winters | H01L 51/56 438/29 |
| 2007/0190887 A1 | 8/2007 | Sato et al. | |
| 2008/0308931 A1 | 12/2008 | Rinne et al. | |
| 2009/0015151 A1* | 1/2009 | Ishihara | H01L 51/5212 313/504 |
| 2009/0278142 A1* | 11/2009 | Watanabe | H01L 21/6835 257/89 |
| 2011/0037171 A1 | 2/2011 | Rinne et al. | |

FOREIGN PATENT DOCUMENTS

| | | |
|---|---|---|
| CN | 1535085 A | 10/2004 |
| EP | 0520434 A1 | 12/1992 |
| EP | 1132962 A2 | 9/2001 |
| IL | 102269 A | 3/1997 |
| JP | 05-275492 A | 10/1993 |
| JP | 09-298362 A | 11/1997 |
| JP | 09-298362 A1 | 11/1997 |
| JP | 2001-024235 A | 1/2001 |
| JP | 2001-109400 A | 4/2001 |
| JP | 2001-257453 A | 9/2001 |
| JP | 2004-207217 A | 7/2004 |
| JP | 2007-188895 A | 7/2007 |
| JP | 2013-070043 A | 4/2013 |
| KR | 96-0009092 B1 | 7/1996 |
| KR | 10-0213378 B1 | 8/1999 |
| KR | 10-2901-0088430 A | 9/2001 |
| KR | 10-2004-0051524 A | 6/2004 |
| TW | 200421926 A | 10/2004 |

* cited by examiner

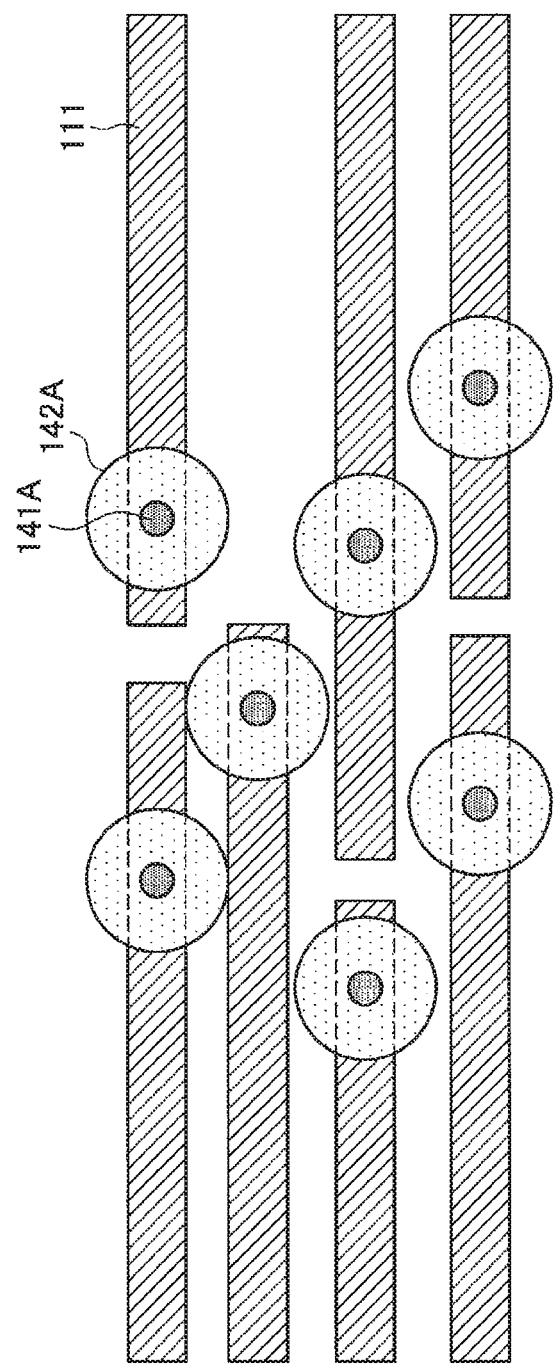

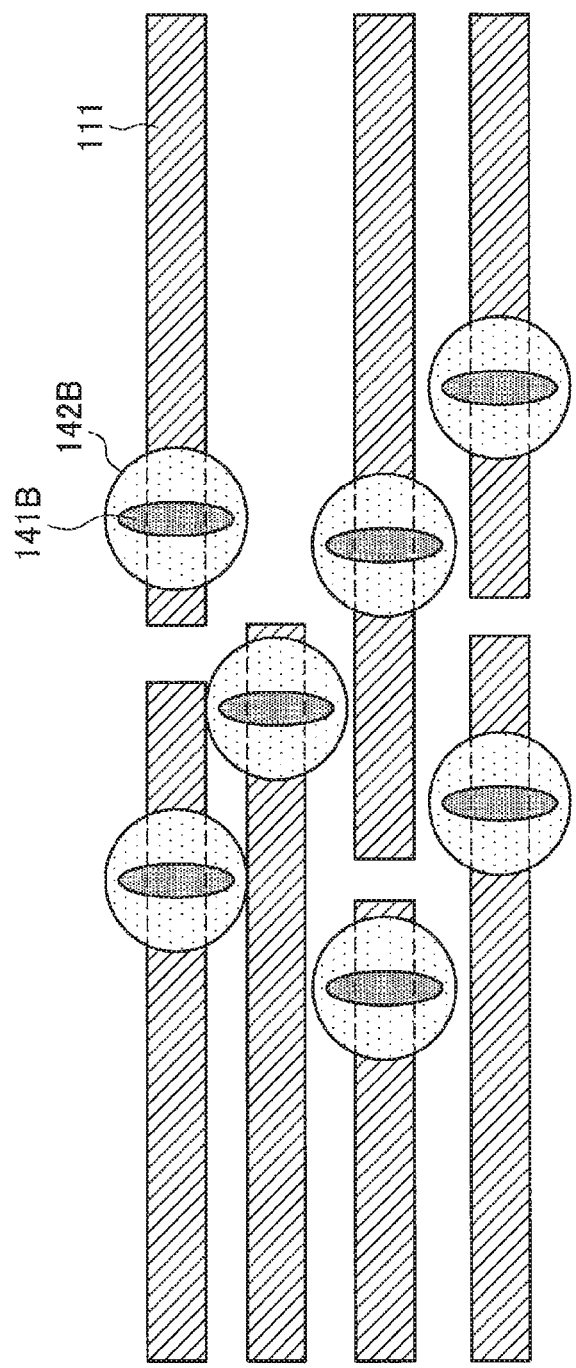

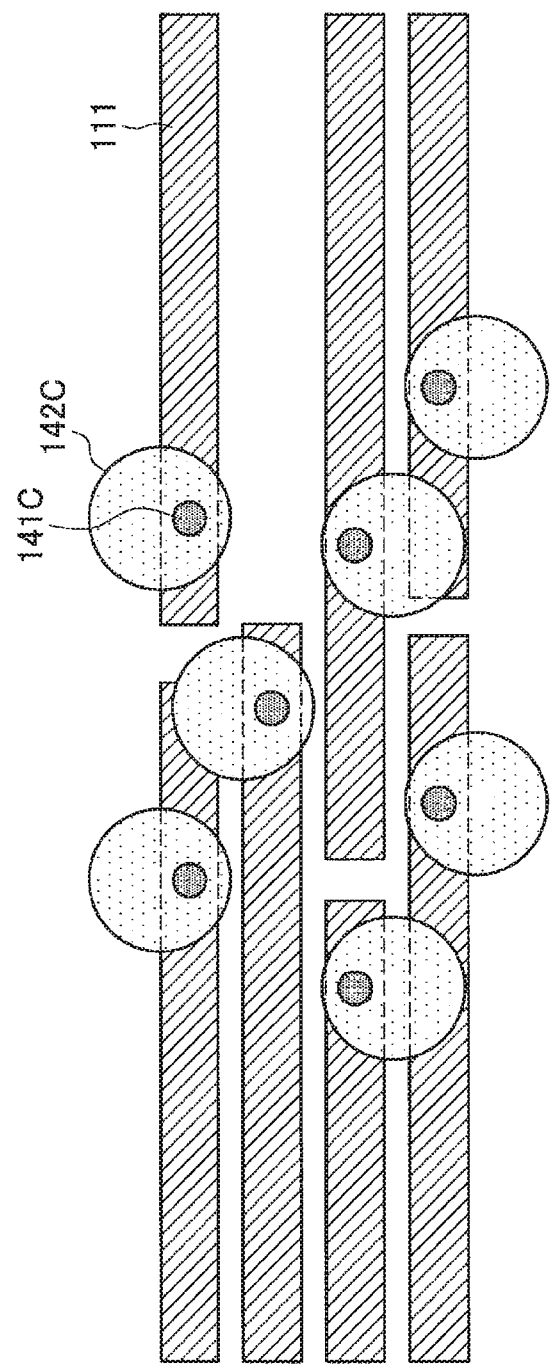

DISPLAY DEVICE AND ELECTRONIC APPARATUS

CROSS REFERENCE TO RELATED APPLICATIONS

This application is a U.S. National Phase of International Patent Application No. PCT/JP2017/012710 filed on Mar. 28, 2017, which claims priority benefit of Japanese Patent Application No. JP 2016-103229 filed in the Japan Patent Office on May 24, 2016. Each of the above-referenced applications is hereby incorporated herein by reference in its entirety.

TECHNICAL FIELD

The present disclosure relates to a display device and an electronic apparatus.

BACKGROUND ART

In these days, in display devices, increases in the areas of display panels are in progress, whereas the miniaturization of circuits of mounted electronic components is in progress. Specifically, the width of an interconnection of an electronic component mounted on a display device is increasingly becoming narrower, and also the distance between electrodes for electrical connection to the outside is increasingly becoming narrower.

For example, Patent Literature 1 below discloses a technology in which a conductor layer used for an interconnection and a terminal of an interconnection board is formed to be embedded in an insulating substrate so as not to protrude from a surface of the insulating substrate, and thereby electrical insulation between terminals is maintained even in a case where the distance between terminals is narrowed.

CITATION LIST

Patent Literature

Patent Literature 1: JP 2013-70043A

DISCLOSURE OF INVENTION

Technical Problem

Mounting with solder is mainly used for connection between an electronic component and a mounting substrate. In the mounting with solder, a metal layer is provided between solder and an electrode on a mounting substrate in order to prevent the solder from diffusing to the electrode.

Here, to suppress the diffusion of the solder to the electrode sufficiently, it is required to thicken the metal layer; on the other hand, to increase the area of the display device, it is required to reduce the thickness of each of the layers provided on the mounting substrate. Hence, a technology that meets both the requirements mentioned above has been desired.

Thus, the present disclosure proposes a new and improved display device and a new and improved electronic apparatus that can prevent the occurrence of connection failure between a mounting substrate and an electronic component, on a large-area mounting substrate.

Solution to Problem

According to the present disclosure, there is provided a display device including: an interconnection layer provided on a support substrate; an insulating layer provided on the interconnection layer and including a plurality of layers; an opening provided in a part of the insulating layer; and a metal layer electrically connected to the interconnection layer and filling the opening up to a height below a layer surface of the insulating layer.

In addition, according to the present disclosure, there is provided an electronic apparatus including: an interconnection layer provided on a support substrate; an insulating layer provided on the interconnection layer and including a plurality of layers; an opening provided in a part of the insulating layer; and a metal layer electrically connected to the interconnection layer and filling the opening up to a height below a layer surface of the insulating layer.

According to the present disclosure, a metal layer is provided in an opening that is provided to pierce an insulating layer including a plurality of layers, and therefore the thickness of the metal layer can be ensured while the thickness of each layer of the insulating layer is reduced.

Advantageous Effects of Invention

As described above, according to the present disclosure, the occurrence of connection failure between a mounting substrate and an electronic component can be prevented on a large-area mounting substrate.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 5A is a top view showing positional relationships in a plane between a first opening and a second opening, and a first interconnection layer in the first modification example.

FIG. 5B is a top view showing positional relationships in a plane between a first opening and a second opening, and a first interconnection layer in the first modification example.

FIG. 5C is a top view showing positional relationships in a plane between a first opening and a second opening, and a first interconnection layer in the first modification example.

MODE(S) FOR CARRYING OUT THE INVENTION

Figure 1:
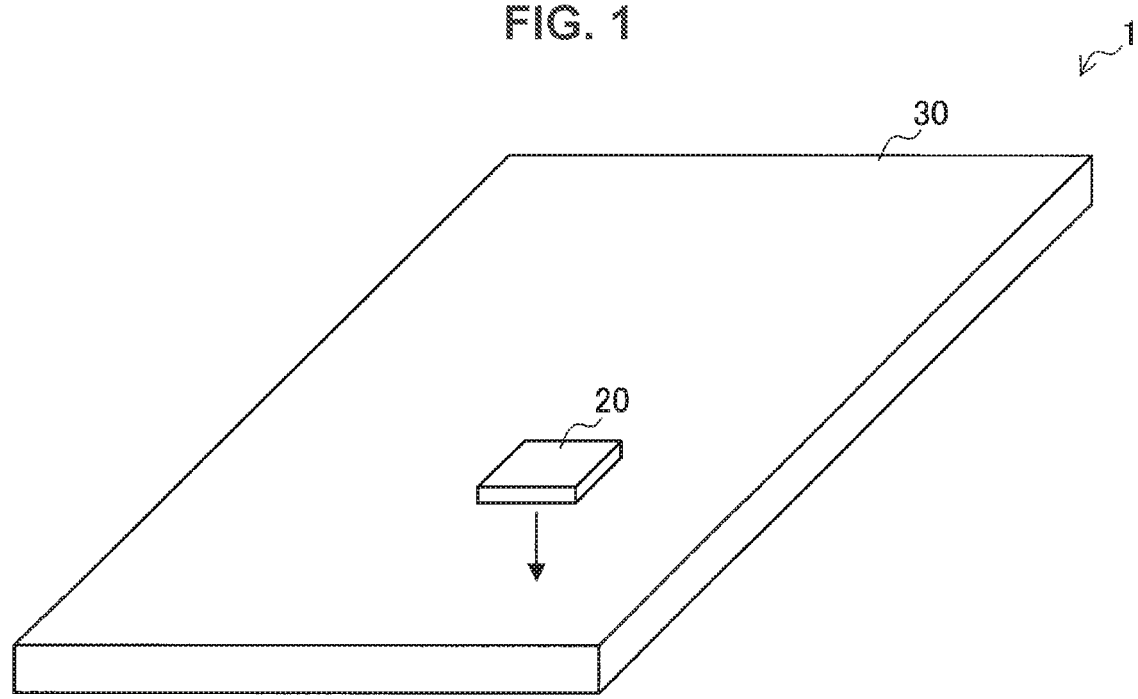
FIG. 1 is an explanatory diagram describing a display device to which the technology according to the present disclosure is applied.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that the description is given in the following order.
1. Technical background regarding present disclosure
2. Embodiment of present disclosure
2.1. Configuration of display device
2.2. Modification examples
2.3. Method for manufacturing display device
3. Conclusions

1. TECHNICAL BACKGROUND REGARDING PRESENT DISCLOSURE

First, the technical background regarding the present disclosure is described with reference to FIG. 1 and FIG. 2. FIG. 1 is an explanatory diagram describing a display device to which the technology according to the present disclosure is applied.

As shown in FIG. 1, in a display device 1 to which the technology according to the present disclosure is applied, an electronic component 20 is mounting on a mounting substrate 30 via solder or the like. Note that the display device 1 is formed by sticking a counter substrate in which a display region and a non-display region are defined, to the mounting substrate 30 on which the electronic component 20 is mounted.

The mounting substrate 30 is a display panel on which optical elements such as light emitting elements or liquid crystal elements included in pixels of the display device 1 are arranged in a matrix form. Further, an interconnection layer that includes an interconnection for transmitting a driving signal for image display to each of the optical elements and an electrode receiving a driving signal from the electronic component 20 is provided in the mounting substrate 30.

The mounting substrate 30 may be a display panel on which light emitting elements such as light emitting diodes (LEDs) or organic electroluminescence (organic EL) elements are arranged in a matrix form, or may be a display panel on which liquid crystal elements are arranged in a matrix form, for example.

The electronic component 20 is, for example, an arithmetic processing device such as a micro-processing unit (MPU) for driving the optical elements arranged on the mounting substrate 30. The electronic component 20 is mounted on the mounting substrate 30 via solder or the like, and is electrically connected to the interconnection layer provided in the mounting substrate 30. Thereby, the electronic component 20 can transmit a driving signal to the optical elements arranged on the mounting substrate 30.

Next, the mounting of the mounting substrate 30 like the above and the electronic component 20 via solder or the like is described with reference to FIG. 2. FIG. 2 is a cross-sectional view of the mounting substrate shown in FIG. 1 taken along the stacking direction.

Figure 2:
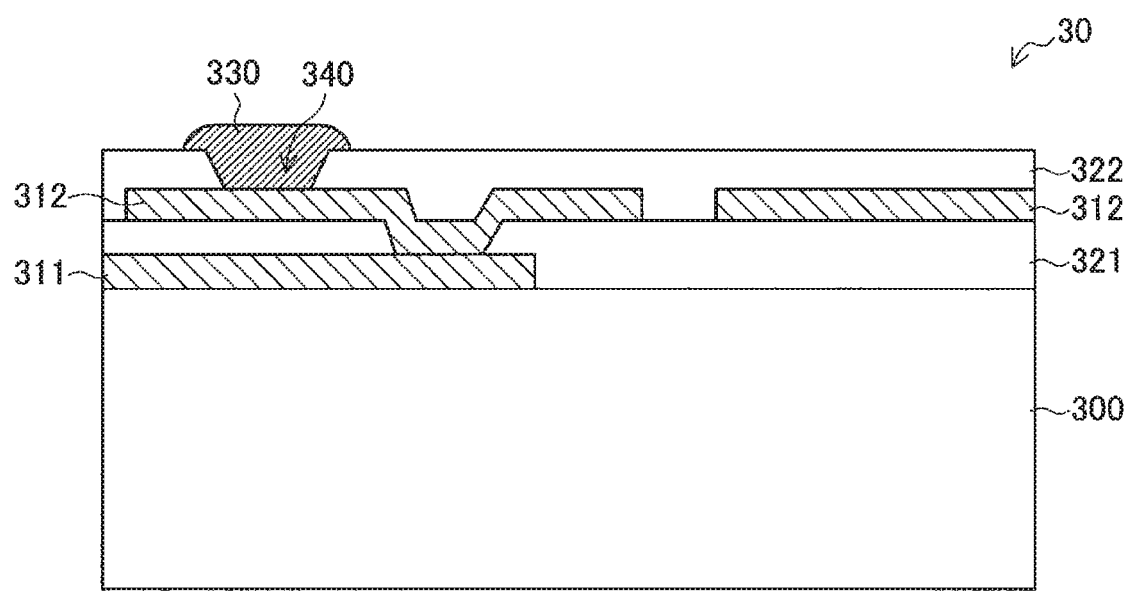
FIG. 2 is a cross-sectional view of a mounting substrate shown in FIG. 1 taken along a stacking direction.

As shown in FIG. 2, the mounting substrate 30 includes a plurality of optical elements (not illustrated), interconnection layers 311 and 312, insulating layers 321 and 322, and a metal layer 330.

A support substrate 300 is, for example, a glass substrate, a resin substrate, a semiconductor substrate such as a silicon substrate, or the like. Further, the interconnection layers 311 and 312 contain copper (Cu), aluminum (Al), or the like, and are provided on the support substrate 300. The interconnection layers 311 and 312 are connected to optical elements (not illustrated) functioning as pixels, or the like, and transmit driving signals to the optical elements.

Each of the insulating layers 321 and 322 contains an insulating organic resin or the like, and the insulating layers 321 and 322 are provided on the support substrate 300, and embed the interconnection layers 311 and 312 therein, respectively. By the insulating layers 321 and 322, insulating properties can be ensured on an insulating layer basis, and therefore the interconnection layers 311 and 312 can have a multiple-layer interconnection structure.

The metal layer 330 is provided by filling an opening 340 provided in the insulating layer 322 with a metal such as nickel (Ni), and is electrically connected to the interconnection layer 312. Further, the electronic component 20 is provided on the metal layer 330 via solder. The metal layer 330 and an electrode of the electronic component 20 can be electrically and physically connected together by causing solder to melt (also called reflow) by heating and then solidifying the solder.

Here, solder reacts with copper (Cu), aluminum (Al), or the like during reflow; hence, in a case where a connection with the electronic component 20 is formed by providing solder directly on the interconnection layer 312, there is a possibility that connection failure will occur between the mounting substrate 30 and the electronic component 20.

Thus, a metal layer 330 functioning as what is called an under-bump metal (UBM) is provided between the electronic component 20 and the interconnection layers 312 and 311, and thereby the reaction between solder and copper (Cu) or aluminum (Al) is suppressed. The metal layer 330 contains nickel (Ni) or the like, which has low reactivity with solder, and furthermore is provided to have a thickness of, for example, more than or equal to 3 μm in order to ensure barrier properties between the solder and the interconnection layer 312.

On the other hand, in a display device 1 having a large screen, the insulating layer provided on the support substrate 300 is formed to be a thin film with a thickness of, for example, less than or equal to 1 μm in order to suppress the warpage of the support substrate 300. Note that the size of such a display device 1 having a large screen is, for example, 300 mm to 900 mm in the vertical direction and 500 mm to 1600 mm in the horizontal direction.

Therefore, in a case where the thickness of each of the metal layer 330 and the insulating layer 322 is set in the above manner, the metal layer 330 protrudes from the surface of the insulating layer 322. Further, the metal layer 330 protruding from the surface of the insulating layer 322 is formed to spread in the in-plane direction of the insulating layer 322 more than the planar shape of the opening 340 of the insulating layer 322. In particular, in a case where the metal layer 330 is formed by a plating method, the metal layer 330 grows isotropically, and therefore the metal layer 330 protruding from the surface of the insulating layer 322 is formed to spread more in the in-plane direction than in the thickness direction of the insulating layer 322.

In such a case, the metal layer 330 spread in the in-plane direction is likely to come into contact with an adjacent metal layer 330, and therefore increases the possibility that a short circuit between adjacent metal layers 330 will be caused to occur. In particular, in association with the progress of the miniaturization of the circuit of the electronic component 20, the distance between electrodes provided in the electronic component 20 is narrowed to, for example, less than or equal to 50 µm, and also the distance between metal layers 330 facing electrodes of the electronic component 20 is narrowed. Hence, a technology that prevents a short circuit between metal layers 330 has been desired more.

The technology according to the present disclosure has been made in view of the circumstances mentioned above. In the following, the technology according to the present disclosure conceived on the basis of the background described above is described in detail.

2. EMBODIMENT OF PRESENT DISCLOSURE

2.1. Configuration of Display Device

Figure 3:
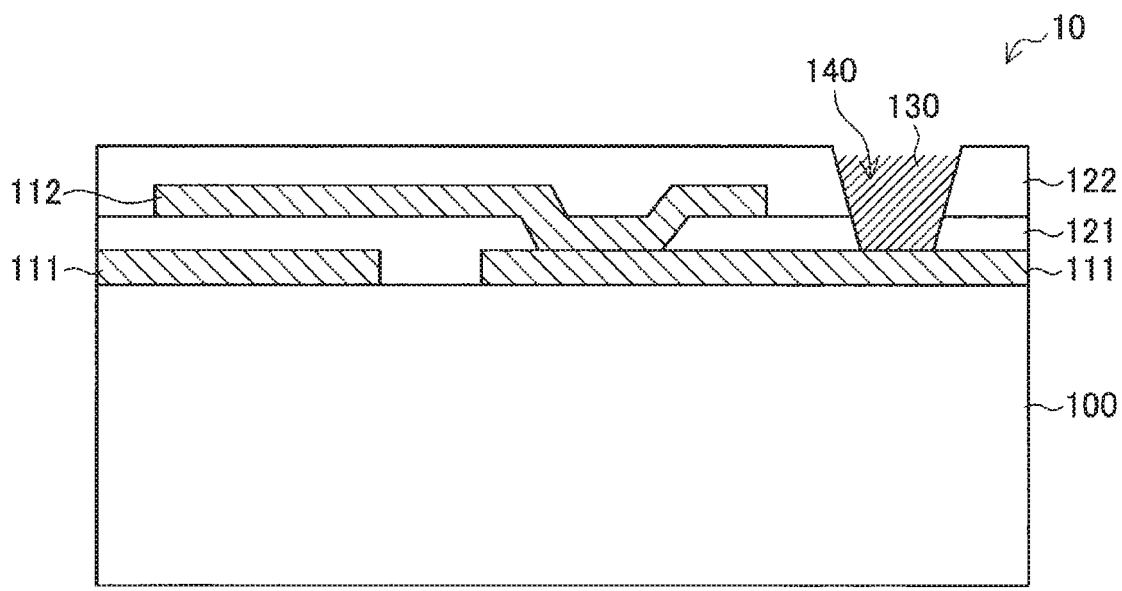
FIG. 3 is a cross-sectional view of a mounting substrate used in a display device according to an embodiment of the present disclosure, which substrate is taken along a stacking direction.

First, a display device according to an embodiment of the present disclosure is described with reference to FIG. 3. FIG. 3 is a cross-sectional view of a mounting substrate used in a display device according to the present embodiment, which substrate is taken along the stacking direction.

As shown in FIG. 2, a mounting substrate 10 used for a display device according to the present embodiment includes a support substrate 100, a first interconnection layer 111, a first insulating layer 121, a second interconnection layer 112, a second insulating layer 122, and a metal layer 130.

Note that the electronic component 20 is mounted on the mounting substrate 10 via solder mounted on the metal layer 130. The electronic component 20 mounted on the mounting substrate 10 may be, for example, an optical element such as a light emitting diode (LED), a passive element such as a capacitor or a resistance, an active element such as a transistor, an arithmetic processing device such as an MPU for causing the elements described above to be driven, a power management integrated circuit (PMIC), a storage device such as a dynamic random access memory (DRAM) or a flash memory, etc.

The support substrate 100 is a support body of the mounting substrate 10. Examples of the support substrate 100 include various glass substrates, various resin substrates, and semiconductor substrates such as a silicon substrate. The support substrate 100 may be a transparent substrate, and may be a bendable, flexible substrate.

Further, an optical element functioning as a pixel of the display device and an element such as a transistor that causes the optical element to be driven may be provided on the support substrate 100. The optical element may be a light emitting element such as an LED or an organic EL element, or a polarizing element such as a liquid crystal element. That is, the display device according to the present embodiment may be any of a liquid crystal display device, an LED display device, and an organic EL display device.

The first interconnection layer 111 is provided on the support substrate 100, and functions as an interconnection and an electrode connected to a circuit or an optical element provided on the support substrate 100. The first interconnection layer 111 may contain, for example, a low-resistance metal material such as copper (Cu) or aluminum (Al). The pitch of interconnections in the first interconnection layer 111 may be, for example, 10 µm to 100 µm.

The first insulating layer 121 is provided on the first interconnection layer 111, and electrically insulates the first interconnection layer 111 and the second interconnection layer 112 from each other. Note that, depending on the circuit provided on the mounting substrate 10, the first insulating layer 121 may have an opening for causing the first interconnection layer 111 and the second interconnection layer 112 to be electrically connected together. The first insulating layer 121 contains an insulating material; for example, may contain an organic resin or an inorganic oxynitride. The thickness of the first insulating layer 121 may be, for example, 0.5 µm to 10 µm.

The first insulating layer 121 may contain, for example, one of or a combination of a plurality of organic resins of an epoxy resin, a polyimide resin, a modified polyphenylene ether (PPE) resin, a phenolic resin, a polytetrafluoroethylene (PTFE) resin, a silicon resin, a polybutadiene resin, a polyester resin, a melamine resin, a urea resin, a polyphenylene sulfide (PPS) resin, a polyphenylene oxide (PPO) resin, and the like. Further, the first insulating layer 121 may contain $SiO_2$, SiN, or an oxynitride such as SION.

The second interconnection layer 112 is provided on the first insulating layer 121, and functions as an interconnection and an electrode connected to a circuit element or an optical element provided on the support substrate 100. Similarly to the first interconnection layer 111, the second interconnection layer 112 may contain a low-resistance metal material such as Cu or aluminum (Al). Further, depending on the circuit provided on the mounting substrate 10, the second interconnection layer 112 may be electrically connected to the first interconnection layer 111 via an opening provided in the first insulating layer 121. In such a case, in order to prevent a short circuit, the second interconnection layer 112 is provided so as not to be in contact with the metal layer 130. The pitch of interconnections in the second interconnection layer 112 may be, for example, 10 µm to 100 µm.

The second insulating layer 122 is provided on the second interconnection layer 112, and functions as a protection layer that electrically insulates the second interconnection layer 112 and protects the circuit or the optical element provided on the mounting substrate 10 from the external environment. Similarly to the first insulating layer 121, the second insulating layer 122 may contain an insulating material; for example, may contain the organic resin or the inorganic oxynitride described above. Further, the second insulating layer 122 may contain the same insulating material as the first insulating layer 121, or may contain a different insulating material. The thickness of the second insulating layer 122 may be, for example, 0.5 µm to 10 µm.

The metal layer 130 is provided in an opening 140 that is provided to pierce the first insulating layer 121 and the second insulating layer 122, and is electrically connected to the first interconnection layer 111. Further, the metal layer 130 is provided to fill the opening 140 up to a height not reaching the layer surface of the second insulating layer 122. That is, the height of the exposed surface of the metal layer 130 is lower than the surface of the second insulating layer 122, and the region where the metal layer 130 is formed forms a recess. The thickness of the metal layer 130 may be, for example, 0.5 µm to 10 µm.

The metal layer 130 functions as a terminal (what is called an under-bump metal) for electrically connecting the electronic component 20 and the first interconnection layer 111 together via solder, and contains a metal having high barrier properties to solder. Specifically, the metal layer 130 contains a metal material having low reactivity with solder; for example, may contain nickel (Ni), titanium (Ti), palladium (Pd), platinum (Pt), or tungsten (W), or an alloy of these. Further, in order to reduce the contact resistance, a thin film layer containing gold (Au) may be formed on the surface of the metal layer 130.

Thus, the metal layer 130 is provided in the opening 140 that is provided to pierce a plurality of insulating layers (that is, the first insulating layer 121 and the second insulating layer 122); therefore, even in a case where the film thickness of each of the first insulating layer 121 and the second insulating layer 122 is small, the metal layer 130 can be formed with a thickness by which barrier properties to solder can be ensured.

Further, the metal layer 130 is provided at a height not reaching the surface of the second insulating layer 122; therefore, the metal layer 130 does not grow to spread in the in-plane direction of the second insulating layer 122, and does not have a planar shape that is spread more than the planar shape of the opening 140. Thereby, the metal layer 130 can prevent the distance with another metal layer 130 from narrowing from the design, and can therefore suppress the occurrence of a short circuit between metal layers 130. Further, the planar shape of the metal layer 130 is defined by the planar shape of the opening 140; therefore, the shape stability of the metal layer 130 is improved, and the connection stability between the mounting substrate 10 and the electronic component 20 can be improved more.

Further, the metal layer 130 may include a plurality of layers of different materials.

For example, among the layers included in the metal layer 130, a layer on the first interconnection layer 111 side may contain a metal material having higher barrier properties to solder. The metal material having high barrier properties to solder is a metal material in which the crystal is dense and furthermore a reaction with solder (that is, an alloying reaction with solder) is less likely to progress. Specific examples of the metal material having high barrier properties to solder include a metal material containing a platinum group element, such as platinum or palladium, or an alloy of these. By this configuration, the barrier properties to solder of the metal layer 130 are improved, and the occurrence of connection failure between the mounting substrate 11 and the electronic component 20 can be prevented, while the increase in manufacturing cost is suppressed.

Further, for example, among the layers included in the metal layer 130, a layer on the side facing the first interconnection layer 111 side may contain solder. In association with the miniaturization of the circuit of the electronic component 20, the size of the metal layer 130 is reduced, and accordingly the amount of solder that can be sandwiched between the electrode of the electronic component 20 and the metal layer 130 is reduced when connecting the electronic component 20 and the mounting substrate 11. Thus, solder is put in, among the layers included in the metal layer 130, a layer on the side (that is, the electronic component 20 side) facing the first interconnection layer 111 side in advance, and thereby a sufficient amount of solder for connection between the electronic component 20 and the mounting substrate 11 can be ensured.

Note that, although FIG. 3 shows an example in which two layers of the first insulating layer 121 and the second insulating layer 122 are provided as the insulating layer, the technology according to the present disclosure is not limited to the above example. For example, the insulating layer may include three or more layers. In this event, it is not necessary that interconnection layers be provided in all the portions between adjacent ones of the layers included in the insulating layer, and it is sufficient that an interconnection layer be provided in at least one portion between adjacent ones of the layers.

That is, in the mounting substrate 10 used for the display device according to the present embodiment, a multiple-layer interconnection layer including a plurality of layers is provided on the support substrate 100, and a contact between the electronic component 20 and the interconnection layer in contact with the support substrate 100 is formed by using a metal layer that is provided to pierce the multiple-layer interconnection layer. Thus, in the mounting substrate 10 according to the present embodiment, the number of multiple-layer interconnection layers stacked and the arrangement of interconnections are not particularly limited.

In the display device according to an embodiment of the present disclosure, the metal layer 130 can be formed with a thickness by which barrier properties to solder are ensured, while the thickness of each of the insulating layers provided on the support substrate 100 is reduced. Therefore, the display device according to an embodiment of the present disclosure can prevent the occurrence of failure in the connection between the mounting substrate 10 and the electronic component 20.

2.2. Modification Examples

Next, a first and a second modification example of the display device according to the present embodiment are described with reference to FIGS. 4, 5A, 5B, 5C, 6, and 7.

FIRST MODIFICATION EXAMPLE

Figure 4:
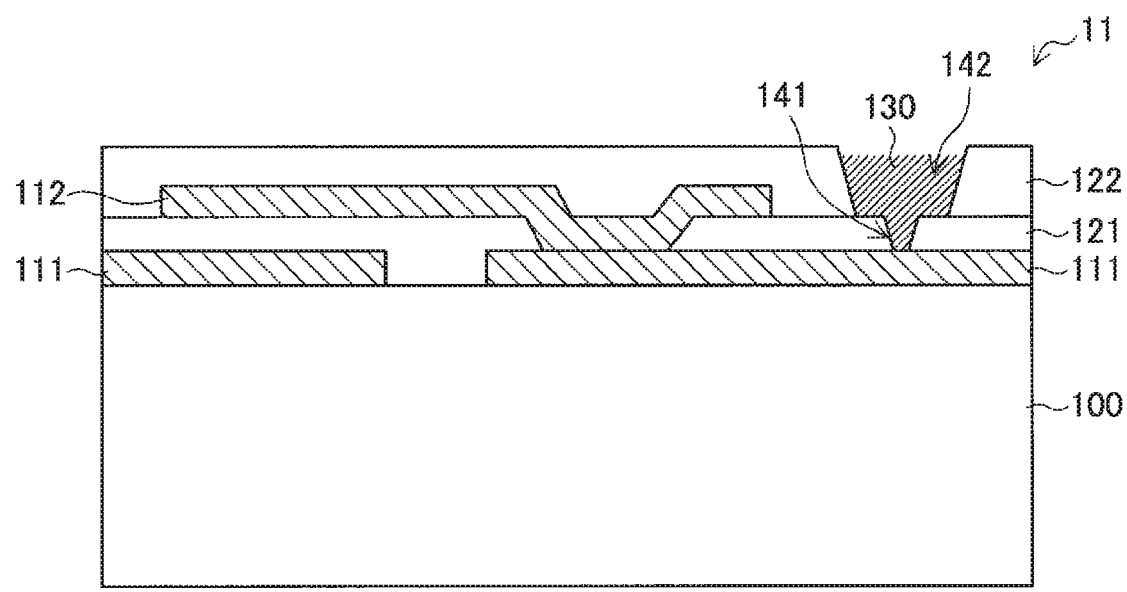
FIG. 4 is a cross-sectional view of a mounting substrate used for a display device according to a first modification example, which substrate is taken along a stacking direction.

First, a mounting substrate 11 used for a display device according to a first modification example is described with reference to FIGS. 4, 5A, 5B, and 5C. FIG. 4 is a cross-sectional view of the mounting substrate 11 used for the display device according to the first modification example, which substrate is taken along the stacking direction.

In the mounting substrate 11 according to the first modification example, the planar shape of an opening that is provided to pierce the first insulating layer 121 and the second insulating layer 122 is different between the first insulating layer 121 and the second insulating layer 122. Note that the other configuration is as described with reference to FIG. 3, and therefore a description herein is omitted.

As shown in FIG. 4, in the mounting substrate 11 according to the first modification example, a first opening 141 is provided in the first insulating layer 121, a second opening 142 is provided in the second insulating layer 122, and the metal layer 130 is provided to fill the first opening 141 and the second opening 142. Further, the first opening 141 and the second opening 142 are provided in mutually different planar shapes in such a manner that the side walls of the interiors of the openings do not continue.

Specifically, the first opening 141 may be provided in a smaller planar shape than the second opening 142. Thereby, the volume of the interior of the opening of the second opening 142 can be made larger; thus, by making the volume of the metal layer 130 larger, the barrier properties to solder of the metal layer 130 can be improved more. Further, by making smaller the area of the first opening 141, which forms an electrical connection between the metal layer 130 and the first interconnection layer 111, the width of the interconnection and the distance between interconnections of the first interconnection layer 111 can be made narrower, and therefore the integration degree of the circuit can be improved.

Further, in a case where the first opening 141 is provided in a smaller planar shape than the second opening 142, the first insulating layer 121 may be provided to have a larger film thickness than the second insulating layer 122. Thereby, the parasitic capacitance that occurs between the first interconnection layer 111 and the metal layer 130 put in the second opening 142 can be reduced.

On the other hand, in a case where the first insulating layer 121 is provided to have a smaller film thickness than the second insulating layer 122, the aspect ratios of the first opening 141 and the second opening 142 are close to 1, and therefore the first opening 141 and the second opening 142 can be formed more easily.

Note that, in the mounting substrate 11 according to the first modification example, the planar shape of the first opening 141 may be larger than the planar shape of the second opening 142. In such a case, the planar area of the metal layer 130 exposed on the surface of the mounting substrate 11 is smaller, and therefore the arrangement flexibility of interconnections etc. on the surface of the mounting substrate 11 can be improved.

Here, specific planar shapes of the first opening 141 and the second opening 142 are described with reference to FIGS. 5A, 5B, and 5C. FIGS. 5A, 5B and 5C are top views showing positional relationships in a plane between the first opening 141 and the second opening 142, and the first interconnection layer 111, in the first modification example.

As shown in FIG. 5A, for example, a first opening 141A and a second opening 142A may be provided in coaxial, substantially circular shapes. Specifically, the first opening 141A may be provided in a substantially circular shape with a diameter smaller than the diameter of the second opening 142A, on the first interconnection layer 111. Further, the second opening 142A is coaxial with the first opening 141A, and furthermore may be provided in a substantially circular shape with a diameter larger than the diameter of the first opening 141A. Thereby, the size of the first opening 141A, which forms an electrical contact between the metal layer 130 and the first interconnection layer 111, can be made smaller than the size of the second opening 142A, and therefore the distance between interconnections of the first interconnection layer 111 can be made narrower.

Further, as shown in FIG. 5B, for example, a first opening 141B may be provided in a planar shape extending in a direction orthogonal to the extending direction of the first interconnection layer 111. Specifically, the first opening 141B may be provided in a substantially elliptical shape in which the major axis is made to be orthogonal to the extending direction of the first interconnection layer 111, on the first interconnection layer 111. Thereby, even in a case where the formation position of the first opening 141B deviates from the design, the first interconnection layer 111 is easily caused to be exposed, and therefore the first opening 141B can form an electrical contact between the metal layer 130 and the first interconnection layer 111 more stably.

Note that the planar shape of the first opening 141B is not limited to the shape shown in FIG. 5B, and may be other shapes. For example, the first opening 141B may be a shape extending in at least one direction, such as a pentagram-like shape or a cross-like shape. Thereby, similarly to the planar shape shown in FIG. 5B, the first opening 141B can form an electrical contact between the metal layer 130 and the first interconnection layer 111 stably.

Furthermore, as shown in FIG. 5C, for example, a first opening 141C and a second opening 142C may be provided in shapes of which the centers are shifted from each other. Specifically, the first opening 141C may be provided in a substantially circular shape on the first interconnection layer 111. Further, the second opening 142C may be placed in a substantially circular shape including the first opening 141C in such a manner that the distance between second openings 142C is wider. Thereby, the positions of second openings 142C can be arranged to be optimized in such a manner that the distance between second openings 142C is widest; thus, the occurrence of a short circuit between metal layers 130 is prevented, and furthermore the distance between interconnections of the first interconnection layer 111 can be made narrower.

Second Modification Example

Figure 6:
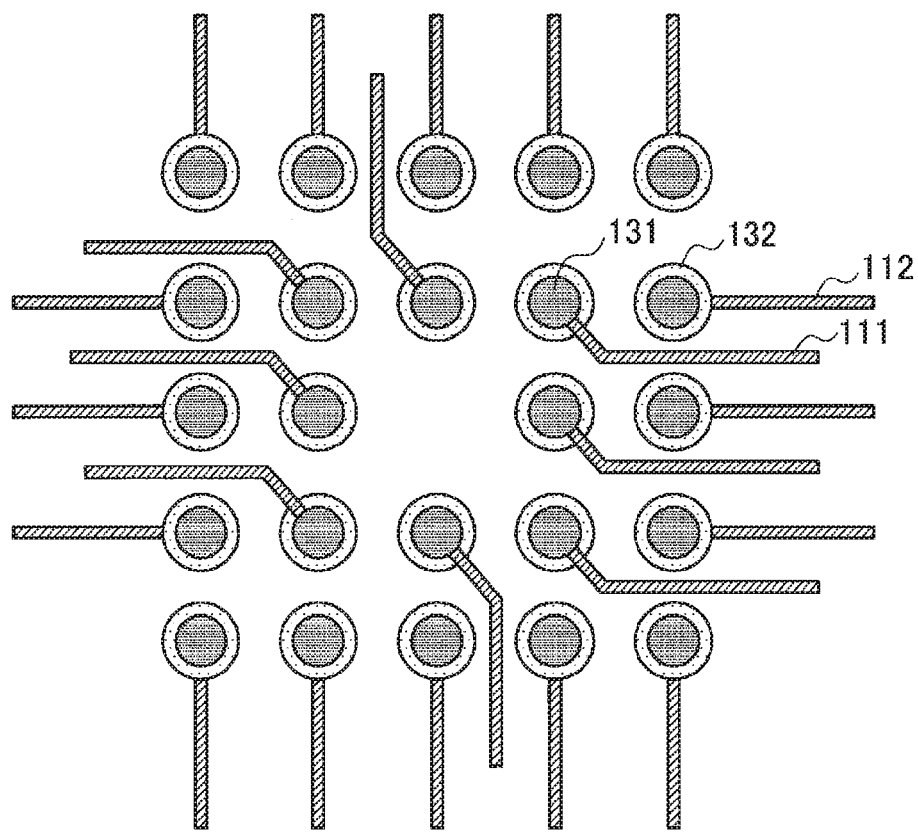
FIG. 6 is a top view of a mounting substrate used for a display device according to a second modification example, which substrate is viewed planarly from a thickness direction.
Figure 7:
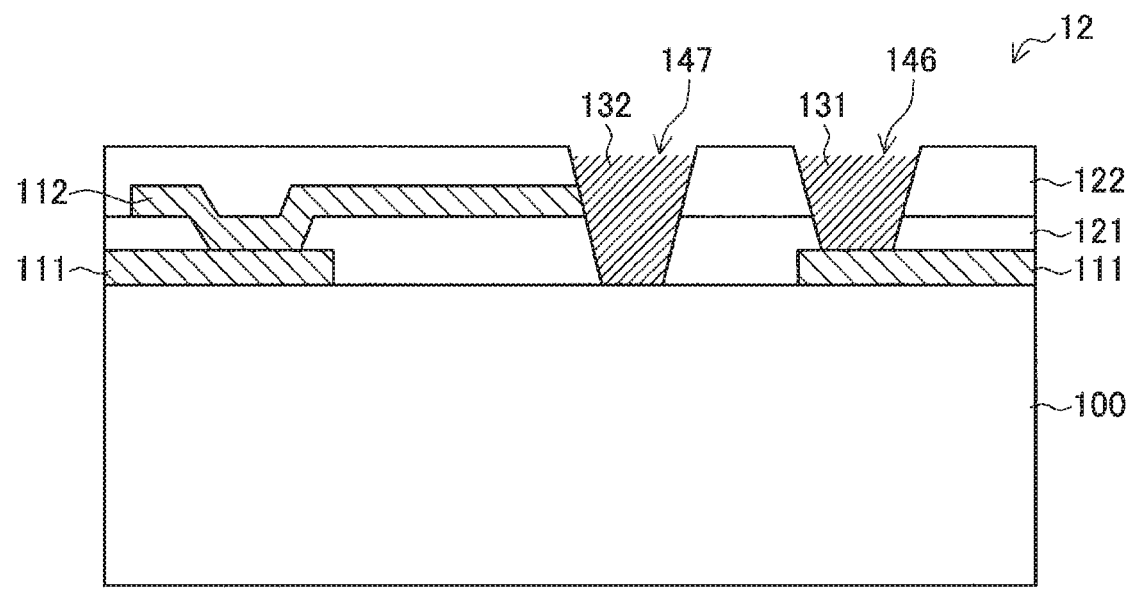
FIG. 7 is a cross-sectional view of the mounting substrate used for the display device according to the second modification example, which substrate is taken along a stacking direction.

Next, a mounting substrate 12 used for a display device according to a second modification example is described with reference to FIG. 6 and FIG. 7. FIG. 6 is a top view of the mounting substrate 12 used for the display device according to the second modification example, which substrate is viewed planarly from the thickness direction, and FIG. 7 is a cross-sectional view of the mounting substrate 12 used for the display device according to the second modification example, which substrate is taken along the stacking direction. Note that the configurations marked with reference characters similar to those of FIG. 3 are as described with reference to FIG. 3, and therefore a description herein is omitted.

As shown in FIG. 6, in the mounting substrate 12 according to the second modification example, a large number of metal layers 131 and 132 that are electrical contacts with the electronic component 20 are arranged in an array form. In such a case, the spacing between the metal layers 131 and 132 is narrow; hence, the interconnections drawn around from the metal layers 131 and 132 are likely to interfere with other interconnections or other metal layers 131 and 132, and a short circuit is likely to occur.

Thus, in the mounting substrate 12 according to the second modification example, the first interconnection layer 111 and the second interconnection layer 112 provided on different layers are caused to be connected independently to the metal layers 131 and 132, respectively, and thereby interference between the first interconnection layer 111 and the second interconnection layer 112 is suppressed.

Specifically, as shown in FIG. 7, in the mounting substrate 12 according to the second modification example, a plurality of openings 146 and 147 that pierce the first insulating layer 121 and the second insulating layer 122 are provided. Further, the metal layers 131 and 132 are provided to fill the openings 146 and 147, respectively; the first interconnection layer 111 is connected to the metal layer 131, and the second interconnection layer 112 is connected to the metal layer 132. Here, it goes without saying that the first interconnection layer 111 connected to the metal layer 131 and the second interconnection layer 112 connected to the metal layer 132 are electrically insulated from each other.

In the mounting substrate 12 according to the second modification example, the metal layers 131 and 132 connected to the first interconnection layer 111 and the second interconnection layer 112 provided on mutually different layers are provided independently, and an electrical contact with the electronic component 20 can be formed in each of the metal layers 131 and 132. Therefore, in the mounting substrate 12, each of the first interconnection layer 111 and the second interconnection layer 112 can be drawn without considering the interference of the drawing-around of interconnections, and thus the occurrence of a short circuit between interconnections of the mounting substrate 12 can be further suppressed.

2.3. Method for Manufacturing Display Device

Next, a method for manufacturing a mounting substrate used for a display device according to the present embodiment is described with reference to FIGS. 8 to 11. FIG. 8 to FIG. 11 are cross-sectional views showing a process of a method for manufacturing a mounting substrate used for a display device according to the present embodiment.

Figure 8:
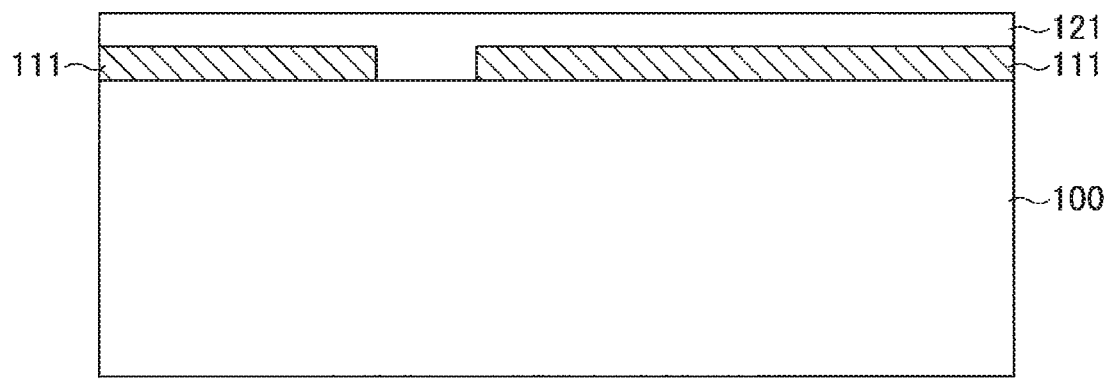
FIG. 8 is a cross-sectional view showing a process of a method for manufacturing a mounting substrate used for a display device according to the embodiment.

First, as shown in FIG. 8, various elements and a first interconnection layer 111 connected to the various elements are provided on the support substrate 100, and the first insulating layer 121 is provided on the first interconnection layer 111.

Specifically, first, an optical element and a circuit element such as a transistor that causes the optical element to be driven are formed on the support substrate 100 (not illustrated). For the method for forming the optical element and the transistor, known common methods may be used, and therefore a description herein is omitted.

Subsequently, the first interconnection layer 111 connected to the optical element and the circuit element on the support substrate 100 is formed. The first interconnection layer 111 can be formed by, for example, forming an underlayer layer containing titanium (Ti) or copper (Cu) by the sputtering method, then depositing copper (Cu) or the like by the electrolytic copper plating method, patterning a resist layer by photolithography, and then performing etching. Next, using the spin coating method or the like, a first insulating layer 121 containing a polyimide, polybenzoxazole, or the like is formed on the first interconnection layer 111.

Figure 9:
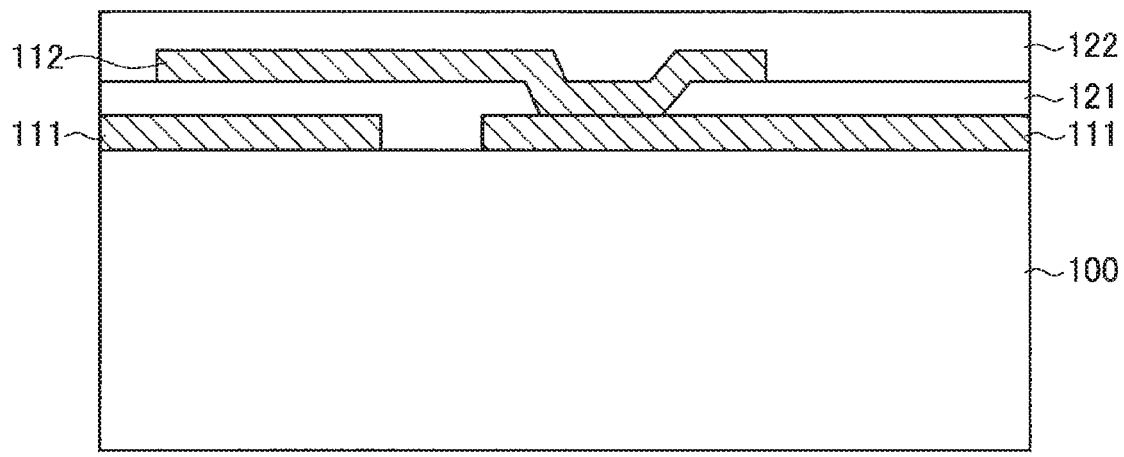
FIG. 9 is a cross-sectional view showing a process of a method for manufacturing a mounting substrate used for a display device according to the embodiment.

Subsequently, as shown in FIG. 9, the second interconnection layer 112 is formed on the first insulating layer 121, and the second insulating layer 122 is formed on the second interconnection layer 112.

Specifically, the second interconnection layer 112 is formed by forming an underlayer layer containing titanium (Ti) or copper (Cu) by the sputtering method, then depositing copper (Cu) or the like by the electrolytic copper plating method, patterning a resist layer by photolithography, and then performing etching. Next, using the spin coating method or the like, a first insulating layer 121 containing a polyimide, polybenzoxazole, or the like is formed on the second interconnection layer 112.

Figure 10:
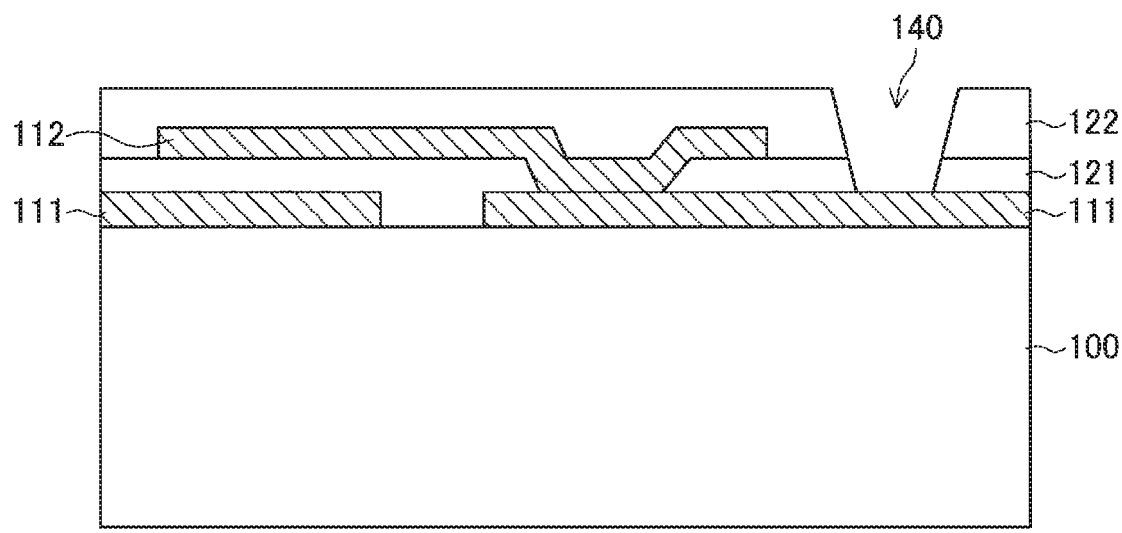
FIG. 10 is a cross-sectional view showing a process of a method for manufacturing a mounting substrate used for a display device according to the embodiment.

Next, as shown in FIG. 10, the opening 140 is formed in the first insulating layer 121 and the second insulating layer 122 by the laser method, the etching method, the photolithography method, or the like. Specifically, in a case where the first insulating layer 121 and the second insulating layer 122 are organic resins, the opening 140 can be formed by the laser method. As the laser used for the laser method, ultraviolet lasers such as a high harmonic YAG laser and an excimer laser, or infrared lasers such as a carbon dioxide gas laser may be used. Further, in a case where the first insulating layer 121 and the second insulating layer 122 are inorganic oxynitrides, the opening 140 can be formed by using a patterned resist layer to protect regions other than the region where the opening 140 is to be formed and then performing wet etching or dry etching. Furthermore, in a case where the first insulating layer 121 and the second insulating layer 122 are substances having photosensitivity, the opening 140 can be formed by the photolithography method.

Figure 11:
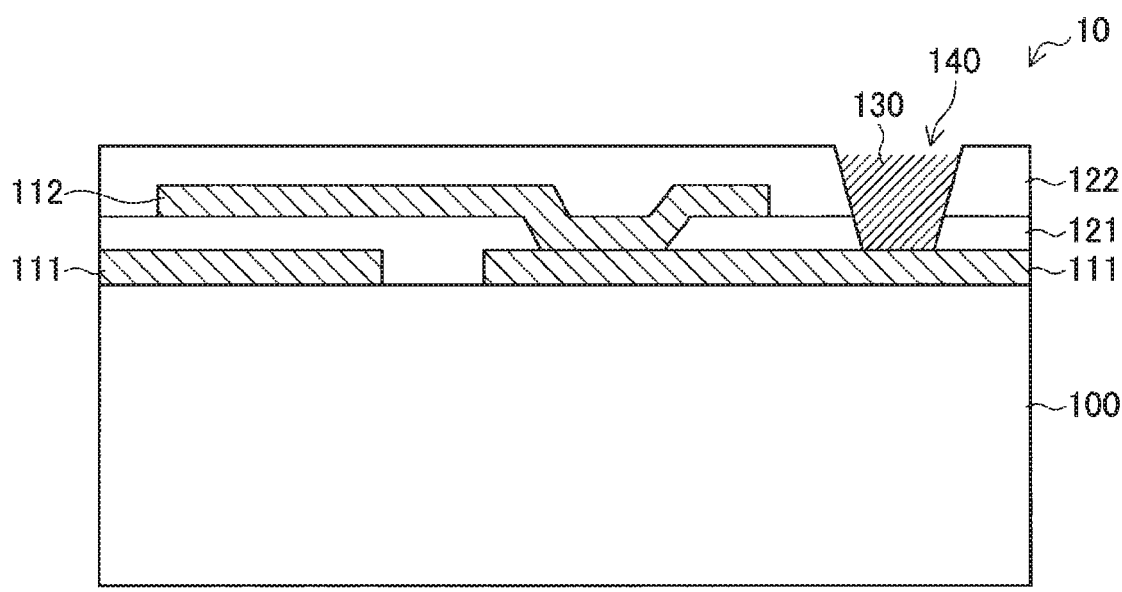
FIG. 11 is a cross-sectional view showing a process of a method for manufacturing a mounting substrate used for a display device according to the embodiment.

Subsequently, as shown in FIG. 11, the metal layer 130 is formed in the opening 140 provided in the first insulating layer 121 and the second insulating layer 122. Specifically, using the electroless plating method and the electrolytic nickel plating method, a metal layer 130 containing nickel (Ni) is caused to be deposited in the opening 140. In the electroless plating method, the metal layer 130 is formed selectively in the opening 140. Further, in the electrolytic plating method, plating is performed on the entire surface; thus, the metal layer 130 can be formed by performing overall etching and removing the unnecessary nickel on the second insulating layer 122. Thereby, the mounting substrate 10 can be formed.

Further, solder is mounted on the metal layer 130 (that is, an under-bump metal), then the electronic component 20 is mounted on the mounting substrate 10, and the solder is caused to reflow by heating; thereby, the electronic component 20 can be mounted on the mounting substrate 10. Note that, in a case where a solder connection electrode has been formed in the electronic component 20 in advance, the electronic component 20 can be mounted on the mounting substrate 10 by mounting the electronic component 20 directly on the metal layer 130 and causing the solder to reflow by heating. After that, a counter substrate is stuck to the mounting substrate 10 using a known common method; thus, the display device according to the present embodiment can be formed.

3. CONCLUSIONS

As described hereinabove, in the display device according to an embodiment of the present disclosure, the thickness of the metal layer 130 can be made a thickness by which barrier properties to solder are ensured sufficiently, while the thickness of each of the insulating layers provided on the support substrate 100 is reduced. Therefore, in the display device according to the present embodiment, the occurrence of connection failure between the mounting substrate 10 and the electronic component 20 can be prevented.

Further, in the display device according to the first modification example of an embodiment of the present disclosure, the metal layer 130 can be formed with higher flexibility by controlling the planar shape of the opening 140 in each layer of the insulating layer that includes a plurality of layers. Thereby, the display device according to the present modification example can improve the barrier properties to solder of the metal layer 130 more, and can suppress the occurrence of connection failure more.

Note that, although in the above a description is given using a display device as an example of an embodiment of the present disclosure, the technology according to the present disclosure is not limited to the foregoing. The technology according to the present disclosure can be applied to any kind of electronic apparatus as long as it is one in which mounting with solder is performed; for example, can be applied to electronic apparatuses such as personal computers, mobile phones, smartphones, and game devices. Also such embodiments are within the technical scope of the present disclosure.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)
A display device including:
an interconnection layer provided on a support substrate;
an insulating layer provided on the interconnection layer and including a plurality of layers;
an opening provided in a part of the insulating layer; and
a metal layer electrically connected to the interconnection layer and filling the opening up to a height below a layer surface of the insulating layer.

(2)
The display device according to (1),
in which an interconnection layer is further provided between layers included in the insulating layer.

(3)
The display device according to (2),
in which the interconnection layer provided between layers of the insulating layer and the interconnection layer provided on the support substrate are electrically insulated from each other.

(4)
The display device according to (1) or (2),
in which a planar shape of the opening is different between layers included in the insulating layer.

(5)
The display device according to (4),
in which a planar shape of an opening provided in, among the layers included in the insulating layer, a layer on a side of the support substrate is smaller than a planar shape of an opening provided in a layer on a side facing the side of the support substrate.

(6)
The display device according to (4) or (5),
in which planar shapes of openings formed in the respective layers included in the insulating layer are shapes coaxial with each other.

(7)
The display device according to any one of (4) to (6),
in which a planar shape of an opening provided in, among the layers included in the insulating layer, a layer in contact with the interconnection layer is a shape extending in a direction orthogonal to an extending direction of the interconnection layer.

(8)
The display device according to any one of (4) to (7),
in which the planar shape of the opening is one of a substantially circular shape and a substantially elliptical shape.

(9)
The display device according to any one of (1) to (8),
in which the metal layer is provided by using a plurality of layers of different materials.

(10)
The display device according to (9),
in which a material of, among the layers included in the metal layer, a layer on a side of the interconnection layer contains a platinum group element.

(11)
The display device according to (9) or (10),
in which a material of, among the layers included in the metal layer, a layer on a side facing a side of the interconnection layer is solder.

(12)
The display device according to any one of (1) to (11),
further including: an electronic component facing the support substrate,
in which the electronic component is electrically connected to the support substrate via solder provided on the metal layer.

(13)
The display device according to any one of (1) to (12),
in which the support substrate is a display panel including an optical element.

(14)
An electronic apparatus including:
an interconnection layer provided on a support substrate;
an insulating layer provided on the interconnection layer and including a plurality of layers;
an opening provided in a part of the insulating layer; and
a metal layer electrically connected to the interconnection layer and filling the opening up to a height below a layer surface of the insulating layer.

REFERENCE SIGNS LIST

1 display device
10 mounting substrate
20 electronic component
100 support substrate
111 first interconnection layer
112 second interconnection layer
121 first insulating layer
122 second insulating layer
130 metal layer
140 opening

The invention claimed is:

1. A display device, comprising:
a first interconnection layer on a support substrate;
a first insulating layer on the first interconnection layer;
a second interconnection layer on the first insulating layer;
a second insulating layer on the second interconnection layer;
a first opening and a second opening, wherein
the second opening includes the first opening,
each of the first opening and the second opening pierces each of the second insulating layer and the first insulating layer,
a shape of each of the first opening and the second opening is substantially circular, and
a center of the first opening is different from a center of the second opening;
a first metal layer in the first opening and a second metal layer in the second opening, wherein
the first metal layer is electrically connected to the first interconnection layer,
the second metal layer is on the first metal layer, the first metal layer and the second metal layer are not connected to the second interconnection layer, each of the second metal layer and the first metal layer fills the first opening up to a height below a layer surface of the second insulating layer, the first metal layer has a different material from the second metal layer.

2. The display device according to claim 1, wherein the first interconnection layer is electrically insulated from the second interconnection layer.

3. The display device according to claim 1, wherein the shape of the first opening is different in each of the second insulating layer and the first insulating layer.

4. The display device according to claim 3, wherein the shape of the first opening in the first insulating layer is smaller than the shape of the first opening in the second insulating layer.

5. The display device according to claim 3, wherein the shape of the first opening in the first insulating layer is coaxial with the shape of the first opening in the second insulating layer.

6. The display device according to claim 3, wherein the shape of the first opening in the first insulating layer is a shape that extends in a direction orthogonal to a direction of extension of the first interconnection layer, and the first insulating layer is in contact with the first interconnection layer.

7. The display device according to claim 1, wherein a material of the first metal layer contains a platinum group element, and the second metal layer is solder.

8. The display device according to claim 1, further comprising an electronic component facing the support substrate, wherein the second metal layer is solder, and the electronic component is electrically connected to the support substrate via the solder.

9. The display device according to claim 1, wherein the support substrate is a display panel including an optical element.

10. An electronic apparatus, comprising:

a first interconnection layer on a support substrate;

a first insulating layer on the first interconnection layer;

a second interconnection layer on the first insulating layer;

a second insulating layer on the second interconnection layer;

a first opening and a second opening, wherein the second opening includes the first opening, each of the first opening and the second opening pierces each of the second insulating layer and the first insulating layer, a shape of each of the first opening and the second opening is substantially circular, and a center of the first opening is different from a center of the second opening;

a first metal layer in the first opening and a second metal layer in the second opening, wherein the first metal layer is electrically connected to the first interconnection layer, the second metal layer is on the first metal layer, the first metal layer and the second metal layer are not connected to the second interconnection layer, each of the second metal layer and the first metal layer fills the first opening up to a height below a layer surface of the second insulating layer, the first metal layer has a different material from the second metal layer.

11. The display device according to claim 1, wherein a thickness of the first insulating layer is different from a thickness of the second insulating layer.

* * * * *